(12) United States Patent
Hessenius et al.

(10) Patent No.: US 12,388,231 B2
(45) Date of Patent: Aug. 12, 2025

(54) LASER SYSTEM FOR HARMONIC GENERATION WITHOUT INTRACAVITY ASTIGMATISM

(71) Applicant: DeUVe Photonics, Inc., Sahuarita, AZ (US)

(72) Inventors: Chris Hessenius, Sahuarita, AZ (US); Mahmoud Fallahi, Sahuarita, AZ (US)

(73) Assignee: DEUVE PHOTONICS, INC., Sahuarita, AZ (US)

( * ) Notice: Subject to any disclaimer, the term of this patent is extended or adjusted under 35 U.S.C. 154(b) by 595 days.

(21) Appl. No.: 17/794,914

(22) PCT Filed: Jan. 25, 2021

(86) PCT No.: PCT/US2021/014912
§ 371 (c)(1),
(2) Date: Jul. 22, 2022

(87) PCT Pub. No.: WO2021/151076
PCT Pub. Date: Jul. 29, 2021

(65) Prior Publication Data
US 2023/0120953 A1 Apr. 20, 2023

Related U.S. Application Data

(60) Provisional application No. 62/965,393, filed on Jan. 24, 2020.

(51) Int. Cl.
*H01S 3/10* (2006.01)
*H01S 3/109* (2006.01)
(Continued)

(52) U.S. Cl.
CPC ............ *H01S 5/0092* (2013.01); *H01S 3/109* (2013.01); *H01S 5/041* (2013.01); *H01S 5/0604* (2013.01);
(Continued)

(58) Field of Classification Search
CPC ........ H01S 5/0092; H01S 3/109; H01S 5/041; H01S 5/0604; H01S 5/141; H01S 3/07;
(Continued)

(56) References Cited

U.S. PATENT DOCUMENTS 5,119,024 A 6/1992 Popovic et al.
7,723,985 B2 5/2010 Smith
(Continued)

FOREIGN PATENT DOCUMENTS

WO 2004064211 A1 7/2004

OTHER PUBLICATIONS

Shin, David. Nonlocal correlations between freely propagating pairs of atoms. Diss. The Australian National University (Australia), 2022.
(Continued)

*Primary Examiner* — Kinam Park
(74) *Attorney, Agent, or Firm* — NGUYEN TARBET IP LAW

(57) ABSTRACT

The present invention describes a laser system for eliminating astigmatism to produce an elliptical laser beam that has an ellipticity between about 0.9 to 1.0. The laser system described herein allows for increased conversion efficiency and output powers. on-linear optical elements in the laser system eliminate astigmatism. The laser system comprises one or more cavities with wavelength splitters that act as dual-mirror chambers for single-pass light transmission through the non-linear optical elements to reduce cavity size or as beam splitters for double-pass light transmission through the non-linear optical elements to increase laser output power. The laser system may also include a birefringent filter and/or etalon in the first cavity for polarization and wavelength tuning. The laser system may also generate a high-power, deep-ultraviolet laser output. The laser system
(Continued)

may also be devoid of curved mirrors and non-normal incidence reflection to eliminate astigmatism.

19 Claims, 8 Drawing Sheets

(51) Int. Cl.
| | |
|---|---|
| *H01S 5/00* | (2006.01) |
| *H01S 5/04* | (2006.01) |
| *H01S 5/06* | (2006.01) |
| *H01S 5/14* | (2006.01) |
| G02F 1/35 | (2006.01) |
| G02F 1/355 | (2006.01) |
| G02F 1/37 | (2006.01) |
| H01S 3/07 | (2006.01) |
| H01S 3/08022 | (2023.01) |
| H01S 3/082 | (2006.01) |
| H01S 3/0941 | (2006.01) |
| H01S 5/183 | (2006.01) |

(52) U.S. Cl.
CPC .............. *H01S 5/141* (2013.01); *G02F 1/354* (2021.01); *G02F 1/3551* (2013.01); *G02F 1/37* (2013.01); *H01S 3/07* (2013.01); *H01S 3/08027* (2013.01); *H01S 3/082* (2013.01); *H01S 3/09415* (2013.01); *H01S 5/0071* (2013.01); *H01S 5/0078* (2013.01); *H01S 5/183* (2013.01)

(58) Field of Classification Search
CPC .. H01S 3/08027; H01S 3/082; H01S 3/09415; H01S 5/0071; H01S 5/0078; H01S 5/183
See application file for complete search history.

(56) References Cited

U.S. PATENT DOCUMENTS

| | | |
|---|---|---|
| 8,422,119 B1 | 4/2013 | Keaton et al. |
| 9,568,565 B2 | 2/2017 | Parsa et al. |
| 9,684,041 B2 | 6/2017 | Nagasak et al. |
| 2004/0252734 A1 | 12/2004 | Karpushko |
| 2008/0019406 A1 | 1/2008 | Abram et al. |
| 2009/0296752 A1 | 12/2009 | Giaretta et al. |
| 2011/0175604 A1 | 7/2011 | Polzer et al. |
| 2013/0021602 A1 | 1/2013 | Dribinski et al. |
| 2015/0071316 A1 | 3/2015 | Chuang |
| 2015/0311673 A1 | 10/2015 | Wang et al. |
| 2017/0212177 A1 | 7/2017 | Coar et al. |
| 2017/0212180 A1 | 7/2017 | Hahn et al. |
| 2017/0212186 A1 | 7/2017 | Hahn et al. |
| 2018/0337516 A1 | 11/2018 | Tatum et al. |
| 2019/0312408 A1 | 10/2019 | Fallahi et al. |

OTHER PUBLICATIONS

Steinert et al. "High sensitivity magnetic imaging using an array of spins in diamond." Review of scientific instruments 81.4 (2010).
Hannegan II, John Michael. Experiments with Frequency Converted Photons from a Trapped Atomic Ion. Diss. University of Maryland, College Park, 2022.
WIPO, "International Search Report and Written Opinion" issued in connection with WIPO Patent Application PCT/US2024/036793, dated Nov. 15, 2024, 11 pages.

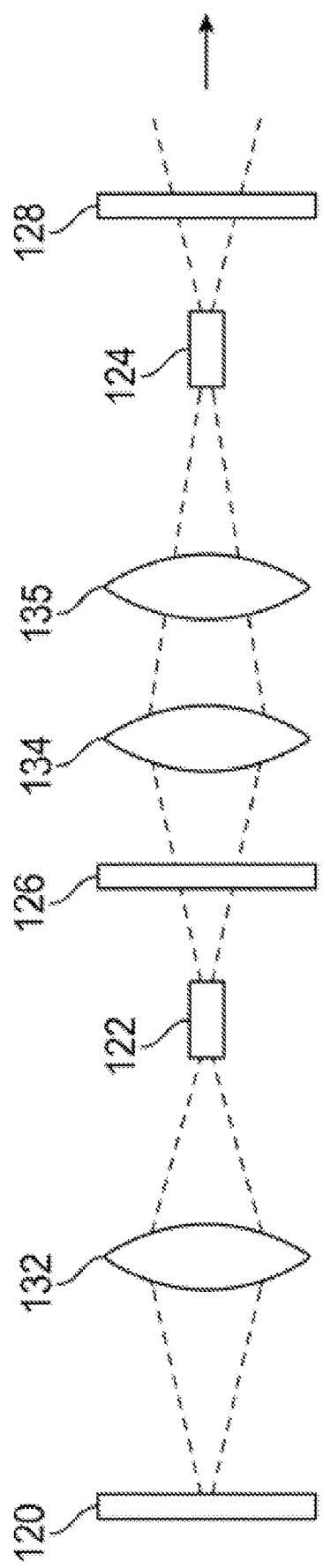
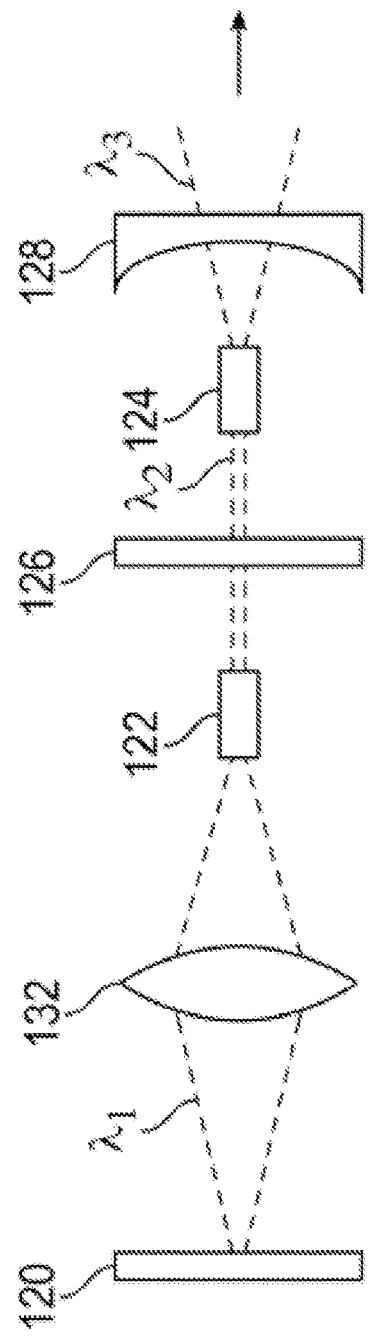

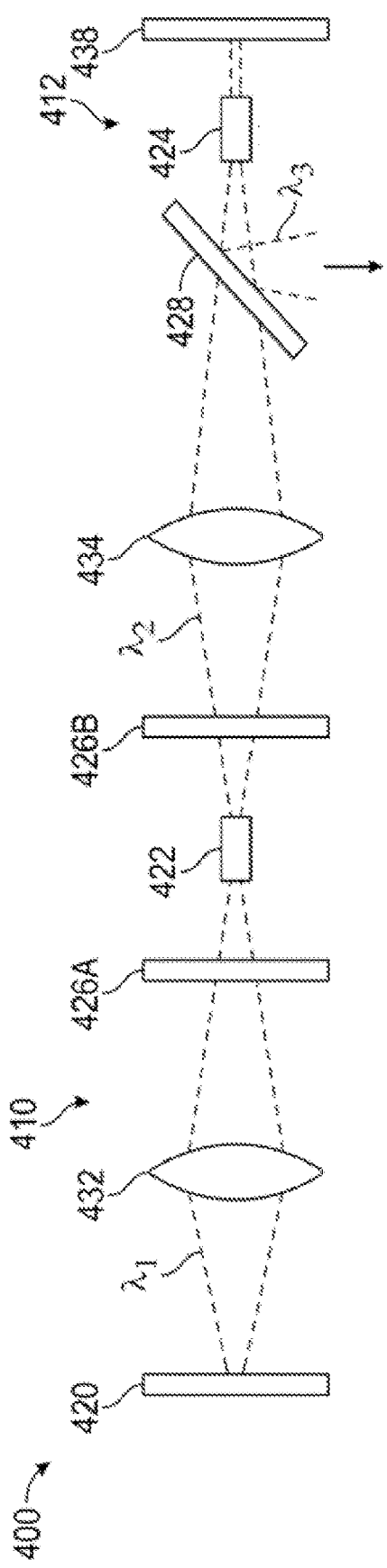
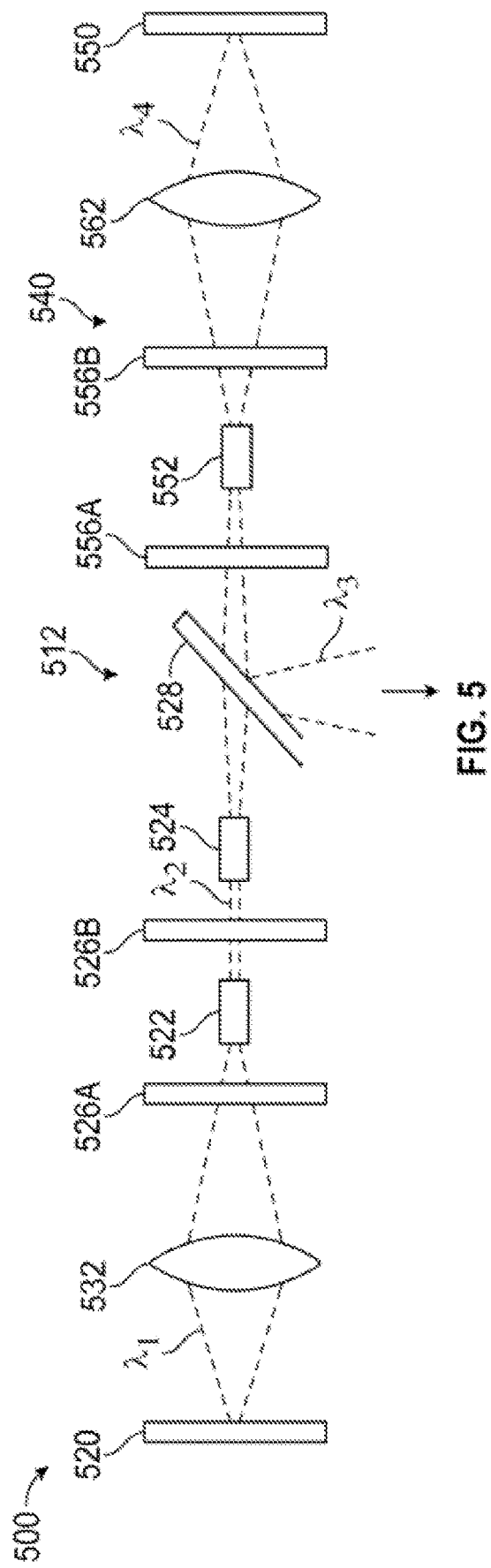
FIG. 4
FIG. 5

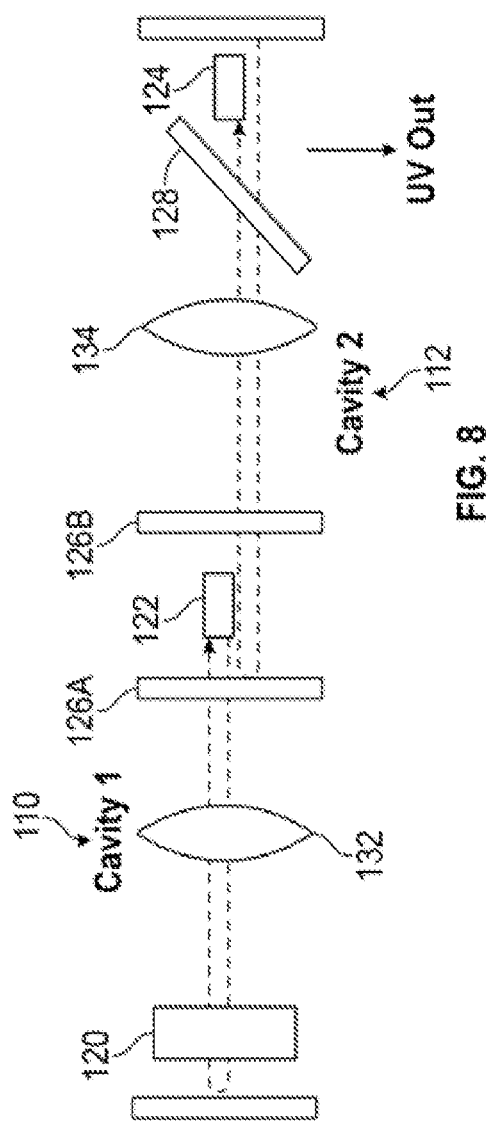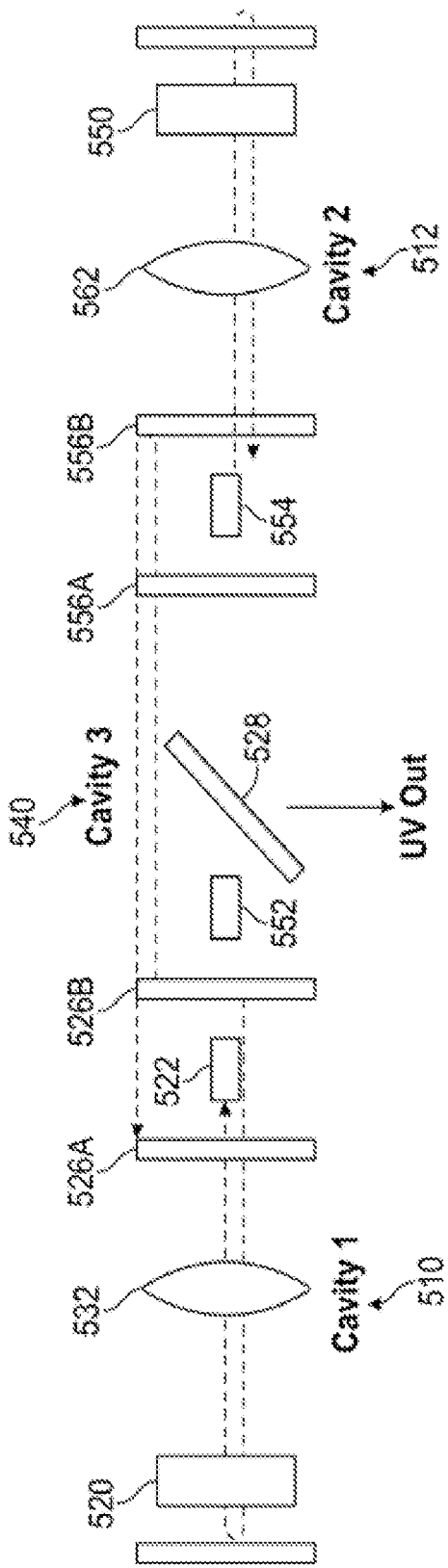

LASER SYSTEM FOR HARMONIC GENERATION WITHOUT INTRACAVITY ASTIGMATISM

CROSS-REFERENCES TO RELATED APPLICATIONS

This application claims benefit of U.S. Provisional Application No. 62/965,393 filed Jan. 24, 2020, the specification(s) of which is/are incorporated herein in their entirety by reference.

BACKGROUND OF THE INVENTION

Laser systems with high-power ultraviolet beams have enormous demand in surgery, data storage and telecommunications. These systems typically include non-linear optical crystals that provide frequency conversion from infrared to ultraviolet light. However, intracavity astigmatism arises due to curved mirrors with non-normal incidence reflection. The astigmatism causes the tangential and sagittal rays in the crystals to focus apart, which reduces conversion efficiency and output power.

BRIEF SUMMARY OF THE INVENTION

It is an objective of the present invention to provide laser systems that allow for increased conversion efficiency and output powers as specified in the independent claims. Without wishing to limit the present invention to any theory or mechanism, the laser system eliminates astigmatism at the non-linear non-linear optical elements in order to increase conversion efficiency and output power. Embodiments of the invention are given in the dependent claims. Embodiments of the present invention can be freely combined with each other if they are not mutually exclusive.

A laser system with harmonic generation includes first and second coupled cavities, a gain medium in the first cavity, a first non-linear optical element in the first cavity, a second non-linear optical element in the second cavity, a first wavelength separator for the first and second cavities, a second wavelength separator for the second cavity and a lens that focuses an elliptical beam (with an ellipticity between about 0.9 to 1.0) into a non-linear optical element.

The laser system may include the first and second cavities that share a couple cavity segments with the first non-linear optical element in the first cavity in the couple cavity segment and the second non-linear optical element in the second cavity outside the couple cavity segment. The laser system may also include a first lens that focuses the light as a elliptical beam (with an ellipticity between about 0.9 to 1.0) into the first non-linear optical element and a second lens that focuses the light as a elliptical beam (with an ellipticity between about 0.9 to 1.0) into the second non-linear optical element. The laser system may also provide the wavelength separators as dual-mirror chambers for single-pass light transmission through the non-linear optical elements to reduce cavity size or as beam splitters for double-pass light transmission through the non-linear optical elements to increase laser output power. The laser system may also include multiple gain mediums to provide a mixed signal wavelength and/or increase laser output power. The laser system may also include a birefringent filter and/or etalon in the first cavity for polarization and wavelength tuning. The laser system may also generate a high-power, deep-ultraviolet laser output. The laser system may also be devoid of curved mirrors and non-normal incidence reflection to eliminate astigmatism.

Preferably, the gain medium is within a VECSEL chip that includes a distributed Bragg reflector and is pumped by a laser diode, the non-linear optical elements are borate crystals, the lenses are spherical lenses, the first wavelength in infrared light, the second wavelength is visible light and the third wavelength is ultraviolet light. The third wavelength can be a third or fourth harmonic of the first wavelength. For instance, the second wavelength can be a second harmonic of the first wavelength and the third wavelength can be a fourth harmonic of the first wavelength. Alternatively, the second wavelength can be a sum/difference of the first wavelength and its second harmonic and the third wavelength can be a second harmonic of the second wavelength and a third harmonic of the first wavelength.

The laser system described herein eliminates astigmatism throughout the entire cavity, including at the non-linear optical elements, which increase conversion efficiency and output power. The laser system also has flexible cavity design that can be customized for specific applications.

One of the unique and inventive technical features of the present invention is the use of one or more lenses to create an elliptical beam, where the beam has an ellipticity between about 0.9 to 1.0. Without wishing to limit the invention to any theory or mechanism, it is believed that the technical feature of the present invention eliminates astigmatism to increase the conversion efficiency and output power of the light beam. None of the presently known prior references or work has the unique inventive technical feature of the present invention. Furthermore, the prior references teach away from the present invention. For example, the cavity is very sensitive to optical losses, e.g. defocus, absorption, scattering, etc. As such, the prior art teaches limiting the addition of components or elements in the cavity. Here, a lens was introduced into the cavity. The introduction of the lens into the cavity to reduce beam ellipticity, e.g. create a circular beam profile, surprisingly drastically minimized the side effect caused by the addition of the elements.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE SEVERAL VIEWS OF THE DRAWING(S)

The features and advantages of the present invention will become apparent from a consideration of the following detailed description presented in connection with the accompanying drawings in which:

FIGS. 1A-1E show the laser system with additional optics.

FIG. 4 shows another embodiment of the laser system where the first cavity and the second cavity are co-linear and co-axial. The second wavelength splitter is angled and outputs the light beam at a third wavelength orthogonally to the laser system.

FIG. 5 shows an alternative embodiment of the laser system where there are three cavities that are co-linear and co-axial to one another. The second wavelength splitter is angled and outputs the light beam at a third wavelength orthogonally to the laser system.

FIG. 8 shows an alternative embodiment of FIG. 1, where the first and second cavities are co-linear and co-axial, and the resulting light beam exits orthogonally from the second cavity.

FIG. 9 shows another embodiment of FIG. 5, where the laser system has three cavities that are co-linear and co-axial, and the resulting light beam exits orthogonally from the third cavity.

Figure 10:
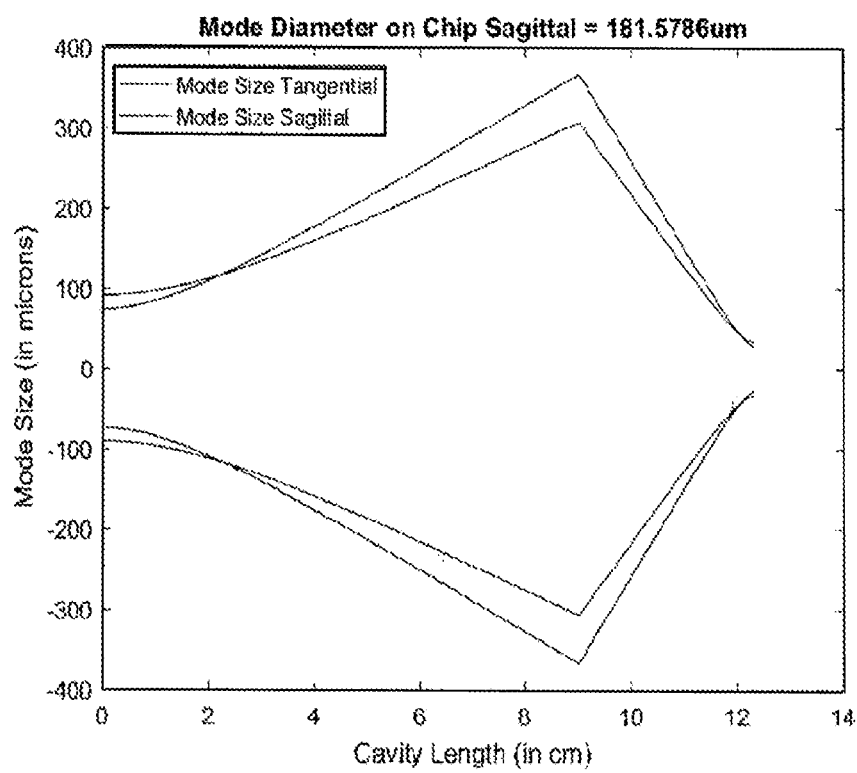

FIG. 10 shows a graph measuring the mode field diameter of a laser cavity that does not incorporate an intracavity lens. The tangential and sagittal rays of the laser mode are shown propagating through a laser cavity. The figure shows angular deviation in the transverse dimensions of the cavity mode.

As used herein, the term "astigmatism" refers to an aberration in which rays propagate in two perpendicular planes and focus at different spatial locations to cause beam ellipticity that varies in the cavity.

As used herein, the term "ellipticity" refers to the degree of divergence of an ellipse from a circle. Ellipticity is the ratio between the minor axis to the major axis of an ellipse, where an ellipticity of 1.0 is a perfect circle. The major and minor axes of an ellipse are diameters of the ellipse. The major axis of an ellipse is its longest diameter, and the minor axis is its shortest diameter.

As used herein, the term "normal incidence reflection" refers to a wavefront that is parallel to an interface and its raypath is perpendicular to the optical elements. Normal incidence reflection is about 85 to 95 degrees. Non-normal incidence reflection is outside this range. For example, the normal incidence reflection is about 85, 86, 87, 88, 89, 90, 91, 92, 93, 94 or 95 degrees. In preferred embodiments, the normal incidence reflection range is about 88 to 92 degrees.

DETAILED DESCRIPTION OF THE INVENTION

Figure 1:
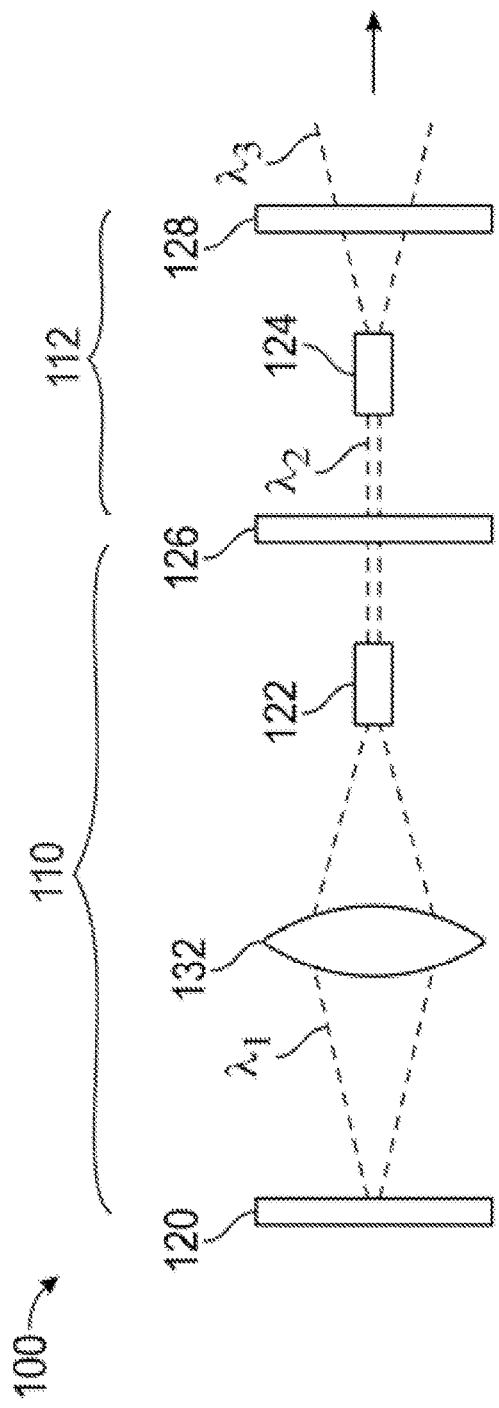
FIG. 1 shows a laser system with a coupled first and second cavity that are in a co-linear and co-axial configuration.

Following is a list of elements corresponding to a particular element referred to herein:
- 100 laser system
- 110 first cavity
- 112 second cavity
- 120 gain medium
- 122 first non-linear optical element
- 124 second non-linear optical element
- 126 first wavelength separator
- 126A first mirror
- 126B second mirror
- 128 second wavelength separator
- 132 first lens
- 134 second lens
- 135 third lens
- 200 laser system
- 210 first cavity
- 212 second cavity
- 220 gain medium
- 222 first non-linear optical element
- 224 second non-linear optical element
- 226 first wavelength separator
- 228 second wavelength separator
- 232 first lens
- 234 second lens
- 236 mirror
- 300 laser system
- 310 first cavity
- 312 second cavity
- 320 gain medium
- 322 first non-linear optical element
- 324 second non-linear optical element
- 326 first wavelength separator
- 326A first mirror
- 326B second mirror
- 328 second wavelength separator
- 332 first lens
- 334 second lens
- 338 third mirror
- 400 laser system
- 410 first cavity
- 412 second cavity
- 420 gain medium
- 422 first non-linear optical element
- 424 second non-linear optical element
- 426 first wavelength separator
- 426A first mirror
- 426B second mirror
- 428 second wavelength separator
- 432 first lens
- 434 second lens
- 438 third mirror
- 500 laser system
- 510 first cavity
- 512 second cavity
- 520 first gain medium
- 522 first non-linear optical element
- 524 second non-linear optical element
- 526 first wavelength separator
- 526A first mirror
- 526B second mirror
- 528 second wavelength separator
- 532 first lens
- 540 third cavity
- 550 second gain medium
- 552 third non-linear optical element
- 554 fourth non-linear optical element
- 556 third wavelength separator
- 556A fourth mirror
- 556B fifth mirror
- 562 second lens
- 600 laser system
- 610 first cavity
- 612 second cavity
- 620 gain medium
- 622 first non-linear optical element
- 624 second non-linear optical element
- 626 first wavelength separator
- 628 second wavelength separator
- 630 birefringent filter
- 631 etalon
- 632 first lens
- 634 second lens
- 636 first mirror
- 638 second mirror 700 laser system
710 first cavity
712 second cavity
720 first gain medium
722 first non-linear optical element
724 second non-linear optical element
726 first beam splitter
728 second beam splitter
730 first birefringent filter
731 first etalon
732 first lens
734 second lens
736 first mirror
738 second mirror
740 third cavity
750 second gain medium
760 second birefringent filter
761 second etalon
762 third lens Referring now to FIG. 1, the present invention features a laser system (100) comprising: a first cavity (110) coupled to a second cavity (112); a gain medium (120); a first non-linear optical crystal (122); a second non-linear optical crystal (124); a first wavelength separator (126) disposed between the first cavity (110) and the second cavity (112); a second wavelength separator (128) disposed in the second cavity (112); and one or more lenses (132). In some embodiments, the gain medium (120) generates light at a first wavelength ($\lambda_1$) in the first cavity (110) using an energy source. One non-limiting example of the energy source includes a laser diode pump. In one embodiment, the first non-linear optical crystal (122) converts the light to a second wavelength ($\lambda_2$) in the first cavity (110). In other embodiments, the second non-linear optical crystal (124) converts the light to a third wavelength ($\lambda_3$) in the second cavity (112). In further embodiments, the one or more lenses (132) focus the light as an elliptical beam into the first non-linear optical element (122). In preferred embodiments, the elliptical beam has an ellipticity of about 0.9 to 1.0. In some embodiments, the elliptical beam has an ellipticity of about 0.90 to 1.00. In further embodiments, the ellipticity is about 0.90, 0.91, 0.92, 0.93, 0.94, 0.95, 0.96, 0.97, 0.98, 0.99, or 1.00. In other embodiments, the elliptical beam is circular.

In one embodiment, the gain medium (120) is within a VECSEL chip. In some embodiments, the first cavity (110) and the second cavity (112) are colinear and coaxial. In other embodiments, the second cavity (112) is orthogonal to the first cavity (110).

In some embodiments, the laser system (100) of the present invention further comprises a second lens (134) disposed between the first wavelength separator (126) and the second non-linear optical element (124). In preferred embodiments, the second lens (134) focuses the light as an elliptical beam into the second non-linear optical element (124), where the elliptical beam has an ellipticity of about 0.9 to 1.0. In some embodiments, the elliptical beam has an ellipticity of about 0.90 to 1.00. In further embodiments, the ellipticity is about 0.90, 0.91, 0.92, 0.93, 0.94, 0.95, 0.96, 0.97, 0.98, 0.99, or 1.00. In other embodiments, the elliptical beam is circular.

In other embodiments, the first wavelength separator (126) further comprises a first mirror (126A) and a second mirror (126B). The first mirror (126A) that transmits the light at the first wavelength ($\lambda_1$) towards the first non-linear optical element (122) and reflects the light at the second wavelength ($\lambda_2$) towards the first non-linear optical element (122). The second mirror (126B) reflects the light at the first wavelength ($\lambda_1$) towards the first non-linear optical element (122) and transmits the light at the second wavelength ($\lambda_2$) towards the second non-linear optical element (124). In further embodiments, the first wavelength separator (126) and the second wavelength separator (128) are beam splitters. In yet another embodiment, the second wavelength separator (128) has a curved surface to focus the light as an elliptical beam into the second non-linear optical element, where the elliptical beam has an ellipticity of about 0.9 to 1.0. In some embodiments, the elliptical beam has an ellipticity of about 0.90 to 1.00. In further embodiments, the ellipticity is about 0.90, 0.91, 0.92, 0.93, 0.94, 0.95, 0.96, 0.97, 0.98, 0.99, or 1.00. In other embodiments, the elliptical beam is circular.

In some embodiments, the first non-linear optical element (122) and the second non-linear optical element (124) are crystals, polymer films, or fibers. In further embodiments, the first (122) and second (124) non-linear optical elements are borate crystals. In other embodiments, the one or more lenses (132) are a spherical lens.

In other embodiments, the first wavelength ($\lambda_1$) is infrared light, the second wavelength ($\lambda_2$) is visible light and the third wavelength ($\lambda_3$) is ultraviolet light. In some embodiments, the first non-linear optical element (122) converts the first wavelength ($\lambda_1$) to the second wavelength ($\lambda_2$). In other embodiments, the second non-linear optical element (124) converts the second wavelength ($\lambda_2$) to the third wavelength ($\lambda_3$). In further embodiments, the first non-linear optical element (122) converts the first wavelength ($\lambda_1$) to the second wavelength ($\lambda_2$) and the second non-linear optical element (124) converts the second wavelength ($\lambda_2$) to the third wavelength ($\lambda_3$). In yet another embodiment, the first non-linear optical element (122) converts the first wavelength ($\lambda_1$) to the second wavelength ($\lambda_2$) and the second non-linear optical element (124) converts a mixed signal wavelength to the third wavelength ($\lambda_3$).

In some embodiments, the third wavelength ($\lambda_3$) is a third harmonic of the first wavelength ($\lambda_1$). In other embodiments, the third wavelength ($\lambda_3$) is a fourth harmonic of the first wavelength ($\lambda_1$). In yet another embodiment, the second wavelength ($\lambda_2$) is a second harmonic of the first wavelength ($\lambda_1$) and the third wavelength ($\lambda_3$) is a fourth harmonic of the first wavelength ($\lambda_1$). In some embodiments, the second wavelength ($\lambda_2$) is a mixed signal of the first wavelength ($\lambda_1$) and a second harmonic of the first wavelength ($\lambda_1$) and the third wavelength ($\lambda_3$) is a second harmonic of the second wavelength ($\lambda_2$) and a third harmonic of the first wavelength ($\lambda_1$).

In one embodiment of the present invention, the laser system (100) further comprises a birefringent filter and an etalon in the first cavity (110), wherein the birefringent filter and the etalon are disposed between the gain medium (120) and the one or more lenses (132). In further embodiments, the laser system (100) is devoid of curved mirrors. In another embodiment, the laser system (100) is devoid of non-normal incidence reflection.

EXAMPLE

The following are non-limiting examples of the present invention. It is to be understood that said examples are not intended to limit the present invention in any way. Equivalents or substitutes are within the scope of the present invention. In the examples listed below, the non-linear optical elements described are non-linear crystals, and the terms are used interchangeably.

Example 1

FIG. 1 shows one embodiment of the laser system (100) described herein. The laser system (100) comprises a first cavity (110) coupled to a second cavity (112). In this configuration, the first cavity (110) and the second cavity (112) are spatially distinct and colinear and coaxial.

The laser system (100) further comprises a gain medium (120), a first (122) and second (124) non-linear optical crystal, a first (126) and second (128) wavelength separator, and one or more lenses (132). The gain medium (120), first non-linear crystal (122) and one or more lenses (132) are located in the first cavity (110), the wavelength separator (126) is located between the first cavity (110) and the second cavity (112), and the second non-linear crystal (124) and second wavelength separator (128) are located in the second cavity (112). The gain medium (120) and first wavelength separator (126) are located at opposite ends of the first cavity (110), the first (126) and second (128) wavelength separators are located at opposite ends of the second cavity (112), and the one or more lenses (132) are located between the gain medium (120) and the first non-linear crystal (122). The wavelength separators (126) and (128) are flat mirrors, and the system (100) is devoid of curved mirrors and non-normal incidence reflection.

During operation, the gain medium (120) generates light at a first wavelength ($\lambda_1$) with a fundamental wavelength at 980 nm (infrared) in response to an energy source (not shown). The light is focused by lens (132) to direct an elliptical beam into the first non-linear crystal (122) which converts the light from the first wavelength ($\lambda_1$) to a second wavelength ($\lambda_2$) as a second harmonic at 490 nm (visible). The elliptical beam has an ellipticity between about 0.9 to 1.0. The elliptical beam enables the first non-linear crystal (122) to provide high conversion efficiency since the tangential and sagittal rays have close focal spots.

The first wavelength separator (126) is transparent to light at the second wavelength ($\lambda_2$) propagating from the first non-linear crystal (122) towards the second non-linear crystal (124) and reflective to light at the first wavelength ($\lambda_1$) propagating from the first non-linear crystal (122) towards the second non-linear crystal (124). As a result, the first wavelength separator (126) transmits the light at the second wavelength ($\lambda_2$) towards the second non-linear crystal (124) and reflects the light at the first wavelength ($\lambda_1$) back at first non-linear crystal (122). The light at the first wavelength ($\lambda_1$) recirculates in the first cavity (110) through the gain medium (120), first non-linear crystal (122) and lens 132 between a flat mirror (not shown) behind the gain medium (120) and the first wavelength separator (126) as end mirrors. The one or more lenses (132) also ensures the first cavity (110) is stable by keeping the light close to the optical axis as it recirculates in the first cavity (110).

The light is an elliptical beam (with an ellipticity between about 0.9 to 1.0) directed into the second non-linear crystal (124) which converts the light from the second wavelength ($\lambda_2$) to a third wavelength ($\lambda_3$) as a fourth harmonic at 245 nm (ultraviolet) with high conversion efficiency. The second wavelength separator (128) is transparent to light at the third wavelength ($\lambda_3$) propagating from the second non-linear crystal (124) and reflective to light at the second wavelength ($\lambda_2$) propagating from the second non-linear crystal (124). As a result, the second wavelength separator (128) transmits the light at the third wavelength ($\lambda_3$) as a laser output and reflects the light at the second wavelength ($\lambda_2$) back at the second non-linear crystal (124). The light recirculates in the second cavity (112) at the second wavelength ($\lambda_2$) through the second non-linear crystal (124) using the first (126) and second wavelength separators (128) as end mirrors. The laser system (100) preferably includes a focusing element in the second cavity (112) to enhance astigmatism elimination and cavity stability as described below.

Figure 1A:
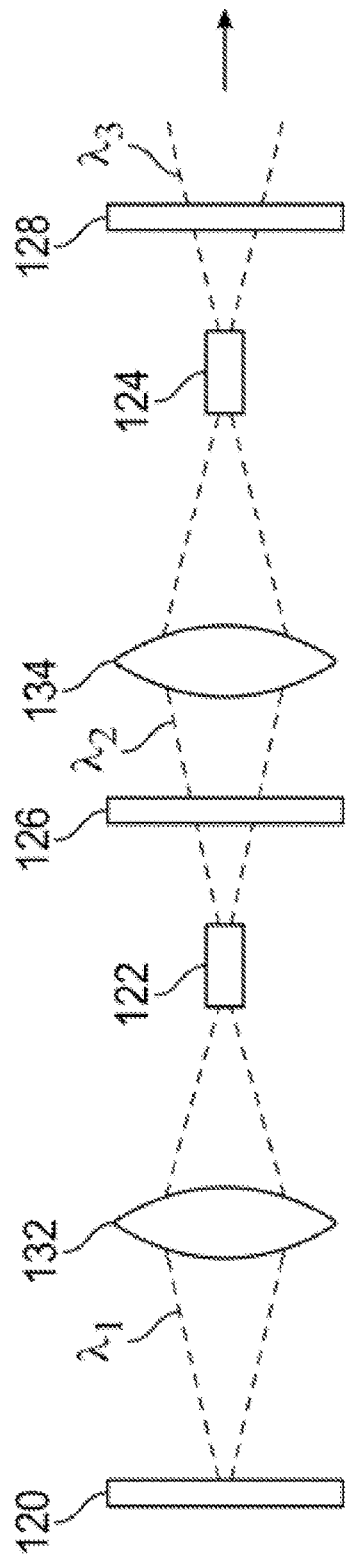

FIG. 1A shows the laser system (100) with a second lens (134) in the second cavity (112) between the second non-linear crystal (124) and the first wavelength separator (126). The second lens (134) focuses the light at the second wavelength ($\lambda_2$) as an elliptical beam (with an ellipticity between about 0.9 to 1.0) into the second non-linear crystal (124) to provide high conversion efficiency in the same manner as the first non-linear crystal (122). The second lens (134) also ensures the second cavity (112) is stable by keeping the light close to the optical axis as it recirculates between the first (126) and second wavelength separators (128).

FIG. 1B shows the laser system (100) with second (134) and third (135) lenses in the second cavity (112) between the second non-linear crystal (124) and the first wavelength separator (126). The second (134) and third (135) lenses in combination focus the light at the second wavelength ($\lambda_2$) as an elliptical beam (with an ellipticity between about 0.9 to 1.0) into the second non-linear crystal (124).

FIG. 1C shows the laser system (100) with the second wavelength separator (128) as a concave-plane mirror having a curved surface that reflects and focuses the light at the second wavelength ($\lambda_2$) as an elliptical beam (with an ellipticity between about 0.9 to 1.0) into the second non-linear crystal (124).

Figure 1D:
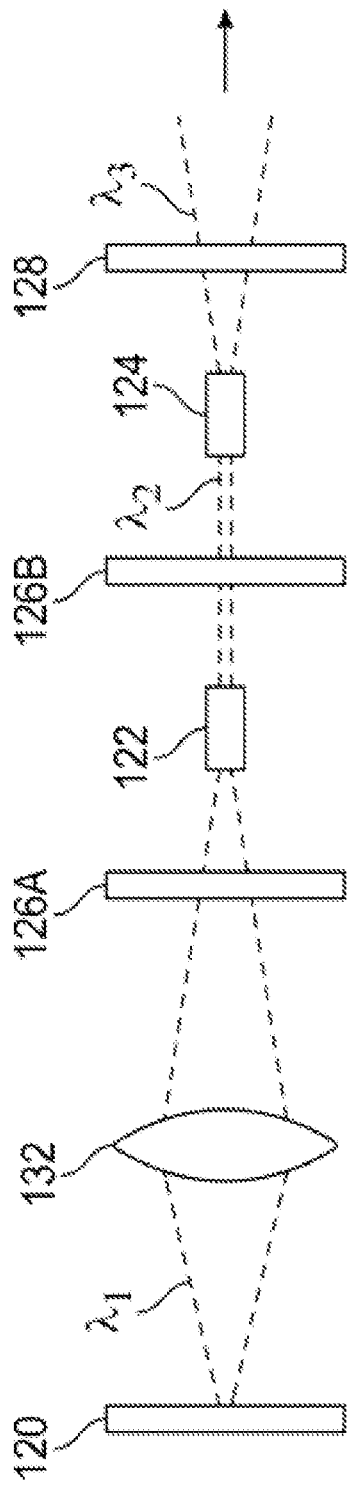

FIG. 1D shows the laser system (100) with the first wavelength separator (126) comprising first (126A) and second (126B) mirrors on either side of the first non-linear crystal (122). The first mirror (126A) is transparent to light at the first wavelength ($\lambda_1$) propagating from the gain medium (120) towards the first non-linear crystal (122) and reflective to light at the second wavelength ($\lambda_2$) propagating from the first non-linear crystal (122) towards the gain medium (120). The second mirror (126B) is transparent to light at the second wavelength ($\lambda_2$) propagating from the second non-linear crystal (124) towards the first non-linear crystal (122) and reflective to light at the first wavelength ($\lambda_1$) propagating from the first non-linear crystal (122) towards the second non-linear crystal (124). As a result, the first mirror (126A) provides an end mirror for the second cavity (112) and the second mirror (126B) provides an end mirror for the first cavity (110).

Figure 1E:
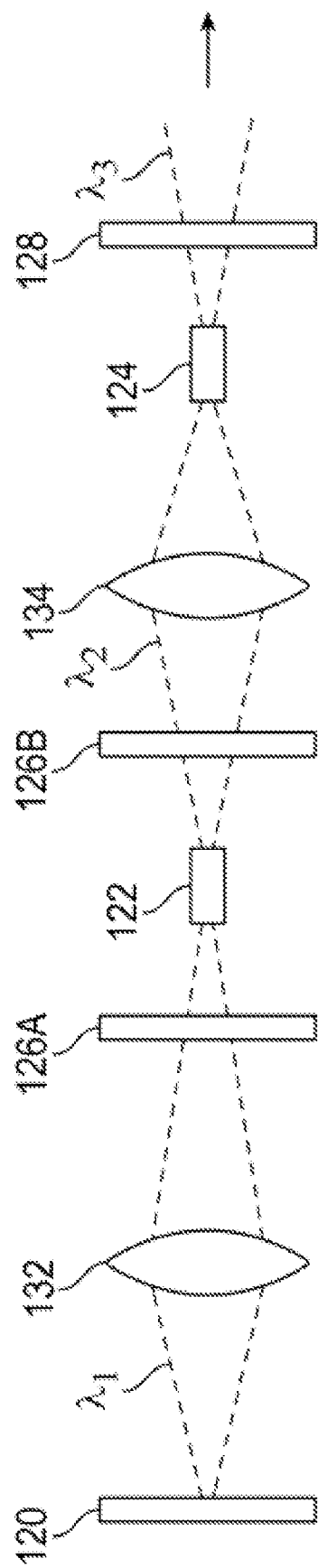

FIG. 1E shows the laser system (100) with the first wavelength separator (126) including the first (126A) and second (126B) mirrors, the first non-linear crystal (122) between first (126A) and second (126B) mirrors and the second lens (134) in second cavity (112) between the second non-linear crystal (124) and the second wavelength separator (128).

Example 2

Figure 2:
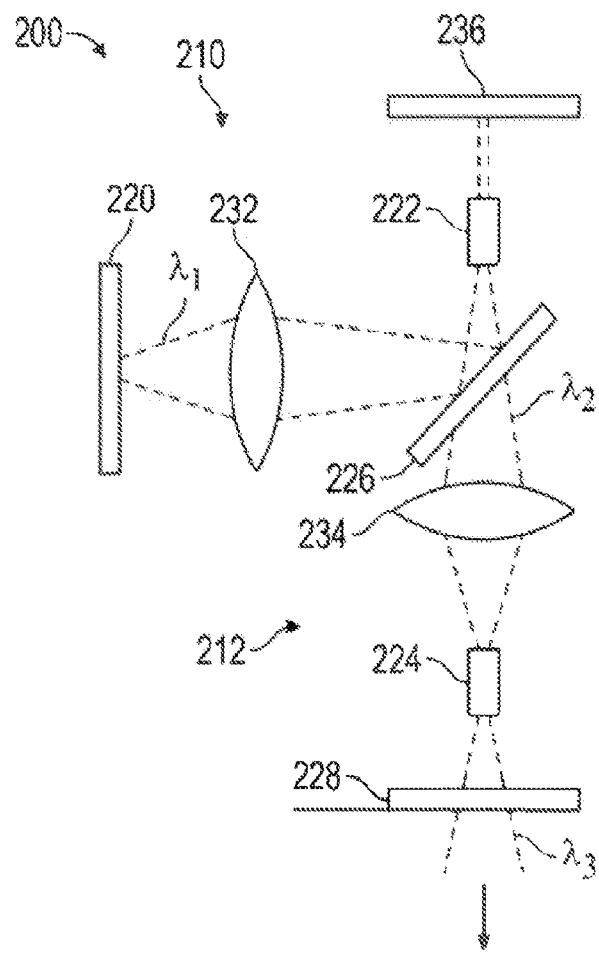
FIG. 2 shows a laser system where the two cavities are perpendicular to one another.

FIG. 2 shows laser system (200) (similar to laser system 100 with optics 1xx renumbered as 2xx) with various modifications in the second cavity network. The first cavity (210) is orthogonal to the second cavity (212), meeting at a T-junction. The first non-linear crystal (222) is located at the T-junction, the first wavelength separator (226) is located below the first non-linear crystal (222), the lens (232) is located in the first cavity (210), and the mirror (236) is located above the first non-linear crystal.

The first wavelength separator (226) reflects the light at the first wavelength ($\lambda_1$) and transmits the light at the second wavelength ($\lambda_2$), and the mirror (236) reflects the light at the first and second wavelengths. As a result, the first wavelength separator (226) is a beam splitter and the mirror (236) is an end mirror for the first (210) and second (212) cavities.

During operation, the gain medium (220) generates light at the first wavelength ($\lambda_1$) which is focused by the lens (232). The first wavelength separator (226) reflects the light at the first wavelength ($\lambda_1$) from the first cavity (210) into the first wavelength separator (226) where it strikes the first non-linear crystal (222) as a focused elliptical beam (with an ellipticity between about 0.9 to 1.0), propagates through the first non-linear crystal (222), reflects off the mirror (236) back through the first non-linear crystal (222), reflects off the first wavelength separator (226) into the first cavity (210) at the first wavelength ($\lambda_1$) and transmits through the first wavelength separator (226) into the second cavity (212) at the second wavelength ($\lambda_2$). The light recirculates in the first cavity (210) at the first wavelength ($\lambda_1$) using the flat mirror behind the gain medium (220) and the mirror (236) as end mirrors.

The lens (234) focuses the light at the second wavelength ($\lambda_2$) as a elliptical beam (with an ellipticity between about 0.9 to 1.0) into the second non-linear crystal (224) which converts the light from the second wavelength ($\lambda_2$) to the third wavelength ($\lambda_3$) and the second wavelength separator (228) reflects the light at the second wavelength ($\lambda_2$) back at the second non-linear crystal (224) and transmits the light out of the second cavity (212) at the third wavelength ($\lambda_3$) as a laser output. The light recirculates in the second cavity (212) at the second wavelength ($\lambda_2$) to recirculate using the second wavelength separator (228) and the mirror (236) as end mirrors.

Example 3

Figure 3:
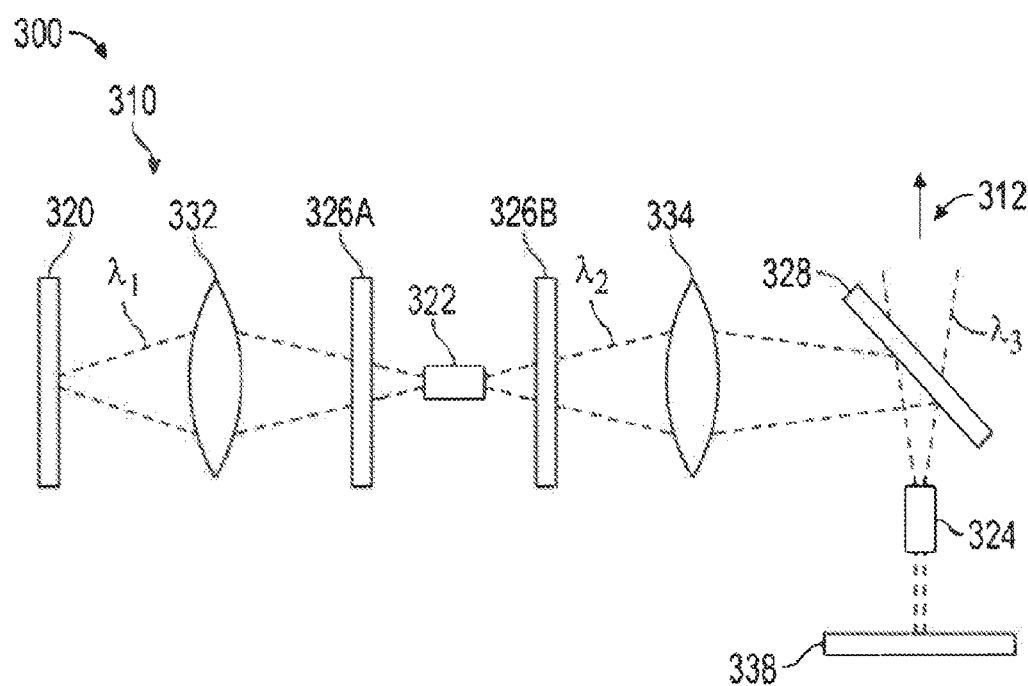
FIG. 3 shows an alternative embodiment of the laser system where the two cavities are perpendicular to one another.

FIG. 3 shows another embodiment of the laser system (100) (optics 1xx renumbered as 3xx) with various modifications in a third cavity network. The second cavity (312) is orthogonal to the first cavity (310) at a junction. The first wavelength separator comprises a first (326A) and a second (326B) mirror. The first non-linear crystal (322) is located in the first cavity between the first (326A) and second (326B) mirror, the second wavelength separator (328) is located at the junction and the second non-linear crystal (324) and a third mirror (338) are located in the second cavity (312).

The second wavelength separator (328) reflects the light at the second wavelength ($\lambda_2$) and transmits the light at the third wavelength ($\lambda_3$), and the third mirror (338) reflects the light at the second and third wavelengths. As a result, the second wavelength separator (328) is a beam splitter and the third mirror (338) is an end mirror for the second cavity (312).

During operation, the gain medium (320) generates light at the first wavelength ($\lambda_1$) which is focused by the lens (332) into the first non-linear crystal (322) and passes through the first wavelength separator (326) at the second wavelength ($\lambda_2$). The second lens (334) focuses the light and wavelength separator (328) reflects the light at the second wavelength ($\lambda_2$) from the first cavity (310) into the second cavity (312) where it focuses into the second non-linear crystal (324) as a elliptical beam (with an ellipticity between about 0.9 to 1.0), propagates through the second non-linear crystal (324), reflects off the third mirror (338) back through the second non-linear crystal (324), reflects off wavelength separator (328) from the second cavity (312) into the first cavity (310) at the second wavelength ($\lambda_2$) and transmits through wavelength separator (328) out of the second cavity (312) at the third wavelength ($\lambda_3$) to provide a laser output. The light recirculates in the second cavity (312) at the second wavelength ($\lambda_2$) using the first wavelength separator (326) and third mirror (338) as end mirrors.

Example 4

FIG. 4 shows an alternate embodiment of laser system (100) (optics 1xx renumbered as 4xx) with various modifications in a fourth cavity network. The second cavity (412) is colinear and coaxial with the first cavity (410). The first wavelength separator (426) comprises a first (426A) and a second (426B) mirror. The first non-linear crystal (422) is located in the first cavity (410) between the first (426A) and second (426B) mirror, the second wavelength separator (428) is between the first (410) and second (412) cavity, the second non-linear crystal (424) and the third mirror (438) are located in the second cavity (412).

The second wavelength separator (428) transmits the light at the second wavelength ($\lambda_2$) and reflects the light at the third wavelength ($\lambda_3$), and the third mirror (438) reflects the light at the second and third wavelengths. As a result, the second wavelength separator (428) is a beam splitter and the third mirror (438) is an end mirror for the second cavity (412).

During operation, the gain medium (420) generates light at the first wavelength ($\lambda_1$) which is focused by the first lens (432) into the first non-linear crystal (422) and passes through the first wavelength separator (426) at the second wavelength ($\lambda_2$). The second lens (434) focuses the light and the second wavelength separator (428) transmits the light at the second wavelength ($\lambda_2$) into the second cavity (412) where it strikes the second non-linear crystal (424) as a focused elliptical beam (with an ellipticity between about 0.9 to 1.0), propagates through the second non-linear crystal (424), reflects off the third mirror (438) back through the second non-linear crystal (424), transmits through the second wavelength separator (428) at the second wavelength ($\lambda_2$) and reflects off the second wavelength separator (428) at the third wavelength ($\lambda_3$) to provide a laser output. The light recirculates in the second cavity (412) at the second wavelength ($\lambda_2$) using the first wavelength separator (426) and the third mirror (438) as end mirrors.

Example 5

FIG. 5 shows yet another embodiment of the laser system (100) (optics 1xx renumbered as 5xx) with various modifications in a fifth cavity network. The system comprises a first cavity (510), a second cavity (512), and a third cavity (540), and the three cavities are spatially distinct and colinear and coaxial. The first (520) and second (550) gain mediums and first (532) and second (562) lenses are located in the first cavity (510) and third cavity (540), respectively, and the first non-linear crystal (522) and third non-linear crystal (552) and the first (526) and third (556) wavelength separators are located in the first cavity (510) and third cavity (540), respectively.

The first wavelength separator (526) comprises first mirror (526A) and second mirror (526B), and the first non-linear crystal (522) is located between the first mirror (526A) and second mirror (526B). Likewise, The third wavelength separator (556) comprises a third mirror (556A)

and fourth mirror (556B), and the third non-linear crystal (552) is located between the third mirror (556A) and fourth mirror (556B). Mirrors (526A) and (556A) are transparent to light at the first wavelength ($\lambda_1$) propagating from gain mediums (520) and (550) towards the first non-linear crystal (522) and the third non-linear crystal (552) respectively and reflective to light at the second wavelength ($\lambda_2$) from the first (522) and third (552) non-linear crystals propagates towards gain mediums (520) and (550) respectively. Mirrors (526B) and (556B) are transparent to light at the second wavelength ($\lambda_2$) propagating from the second (524) and fourth (554) non-linear crystals towards the first (522) and third (552) non-linear crystals respectively and reflective to light at the first wavelength ($\lambda_1$) propagating from first (522) and third (552) non-linear crystals towards the second (524) and fourth (554) non-linear crystals, respectively. As a result, mirrors (526A) and (556B) provide end mirrors for the second cavity (512) and mirrors (526B) and (556A) provide end mirrors for the first cavity (510) and the third cavity (540), respectively.

The second wavelength separator (528) transmits the light at the second wavelength ($\lambda_2$) and reflects the light at the third wavelength ($\lambda_3$). As a result, the second wavelength separator (528) is a beam splitter. During operation, gain mediums (520) and (550) generate light at the first wavelength ($\lambda_1$) which is focused by the first lens (532) and the second lens (562) into the first (522) and third (552) non-linear crystals respectively, and transmits through wavelength separators (526) and (556) respectively into the second cavity (512) at the second wavelength ($\lambda_2$), passes back and forth through the second non-linear crystal (524) as a focused elliptical beam (with an ellipticity between about 0.9 to 1.0), transmits back and forth through the second wavelength separator (528) at the second wavelength ($\lambda_2$) and reflects off the second wavelength separator (528) out of the second cavity (512) at the third wavelength ($\lambda_3$) to provide a laser output. The light recirculates in the second cavity (512) at the second wavelength ($\lambda_2$) using wavelength separators (526) and (556) as end mirrors.

Example 6

Figure 6:
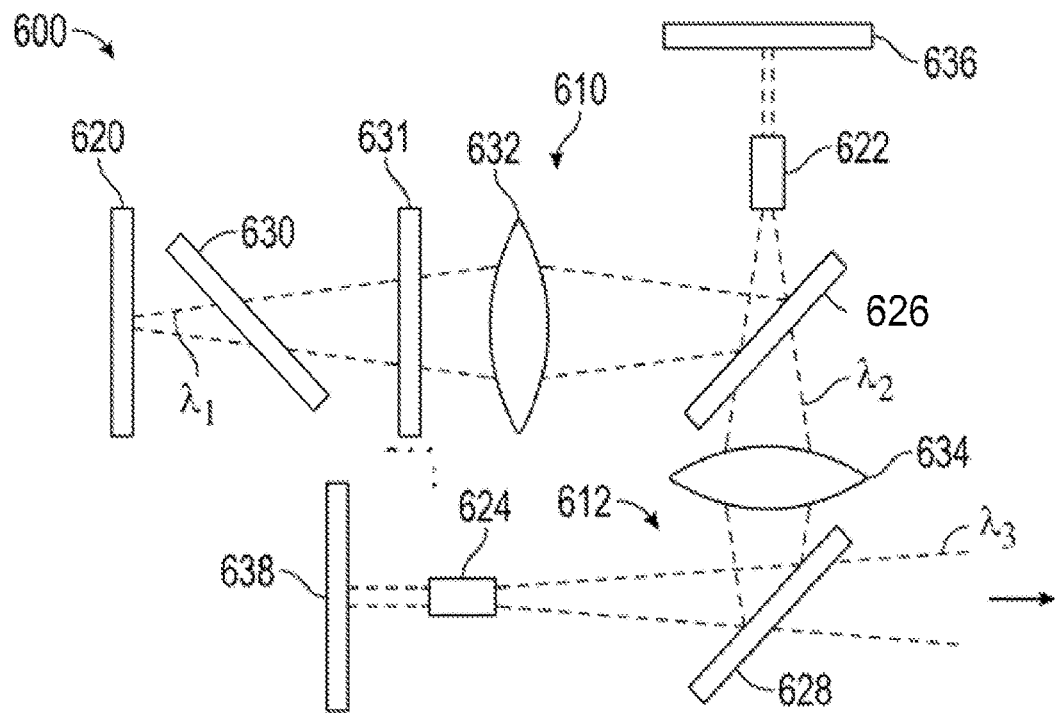
FIG. 6 shows yet another embodiment of a laser system with two cavities that are orthogonal to each other.
Figure 7:
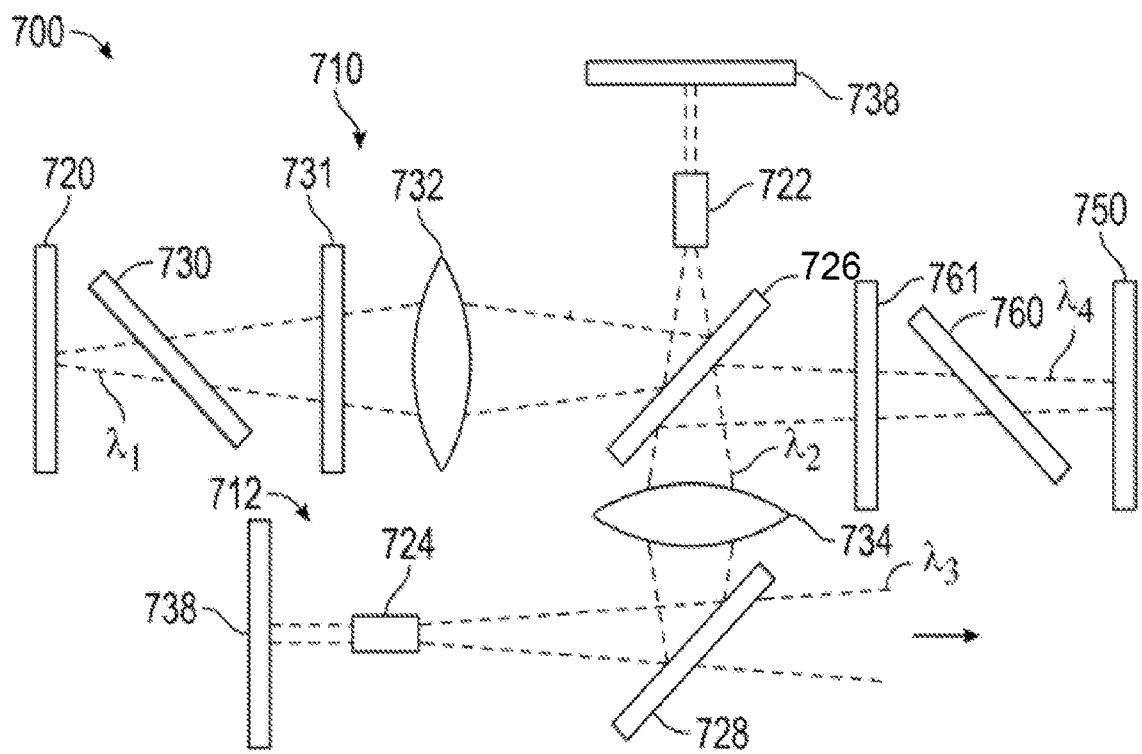
FIG. 7 shows a laser system with two cavities forming a T-shape, where the second cavity is disposed at the center of the first cavity.

FIG. 6 shows another embodiment of the laser system (100) (optics 1xx renumbered as 6xx) with various modifications. The second cavity (612) is orthogonal to the first cavity (610). The first non-linear crystal (622) and the mirror (636) are located in where the first cavity (610) meets the second cavity (612), and the second non-linear crystal (624) and mirror 638 are located on the opposite side of the second cavity (612). The first wavelength separator (626) is located below the first non-linear crystal (622) and the second wavelength separator (628) is located to the right of the second non-linear crystal (624).

The first wavelength separator (626) reflects the light at the first wavelength ($\lambda_1$) and transmits the light at the second wavelength ($\lambda_2$), and the mirror (636) reflects the light at the first and second wavelengths. As a result, the first wavelength separator (626) is a beam splitter and the mirror (636) is an end mirror for the first cavity (610) and the second cavity (612). The second wavelength separator (628) reflects the light at the second wavelength ($\lambda_2$) and transmits the light at the third wavelength ($\lambda_3$), and the mirror (638) reflects the light at the second and third wavelengths. As a result, the second wavelength separator (628) is a beam splitter and mirror 638 is an end mirror for the second cavity (612).

The laser system (600) further comprises a birefringent filter (630) and an etalon (631) disposed to the right of the gain medium (620) in the first cavity (610). The birefringent filter (630) is located between the gain medium (620) and etalon (631), and etalon (631) is located between the birefringent filter (630) and the first lens (632). The first non-linear crystal (622) is located between the first wavelength separator (626) and the mirror (636) and the second non-linear crystal (624) is located between the second wavelength separator (628) and mirror (638). The gain medium (620) is a light amplifier, embedded in a VECSEL chip with a distributed Bragg reflector mounted on a copper heat sink, and pumped by a laser diode. The first non-linear crystal (622) is a lithium triborate (LBO) crystal and the second non-linear crystal (624) is a beta barium borate (BBO) crystal. Wavelength separators (626) and (628) are dichroic flat mirrors, lenses (632) and (634) are spherical lenses and mirrors (636) and (638) are broadband flat mirrors. The birefringent filter (630) is a polarizer and wavelength tuner positioned at Brewster's angle, and the etalon (631) is a wavelength narrower.

During operation, the gain medium (620) generates light at the first wavelength ($\lambda_1$) in response to the laser diode pump. The light is polarized and wavelength tuned by the birefringent filter (630), the wavelength narrowed by the etalon (631) and focused by the first lens (632). The light remains at the first wavelength ($\lambda_1$) in the context of the present invention despite minor wavelength tuning by the birefringent filter (630) and etalon (631). The first wavelength splitter (626) reflects the light at the first wavelength ($\lambda_1$) in the first cavity (610) where it strikes the first non-linear crystal (622) as a focused elliptical beam (with an ellipticity between about 0.9 to 1.0), propagates through the first non-linear crystal (622), reflects off the mirror (636) back through the first non-linear crystal (622), reflects off the first wavelength separator (626) at the first wavelength ($\lambda_1$) and transmits through the first wavelength separator (626) into the second cavity (612) at the second wavelength ($\lambda_2$). The light recirculates in the first cavity (610) at the first wavelength ($\lambda_1$) using the distributed Bragg reflector behind the gain medium (620) and the mirror (636) as end mirrors.

The second lens (634) focuses the light at the second wavelength ($\lambda_2$) as an elliptical beam (with an ellipticity between about 0.9 to 1.0). The second wavelength separator (628) reflects the light at the second wavelength ($\lambda_2$) where it strikes the second non-linear crystal (624) as a focused elliptical beam (with an ellipticity between about 0.9 to 1.0), propagates through the second non-linear crystal (624), reflects off mirror (638) back through the second non-linear crystal (624), reflects off the second wavelength separator (628) at the second wavelength ($\lambda_2$) and transmits through second wavelength separator (628) at the third wavelength ($\lambda_3$) to provide a laser output. The light recirculates in the second cavity (612) at the second wavelength ($\lambda_2$) using mirrors (636) and (638) as end mirrors.

Example 7

Another embodiment of the laser system includes laser system 600 (optics 6xx renumbered as 7xx) with various modifications. The second cavity (712) is disposed orthogonally at the center of the first cavity (710).

The laser system (700) further comprises a first (720) a second (750) gain medium disposed at opposing ends of the first cavity (710). The first birefringent filter (730) is disposed to the right of the first gain medium (720), and the first etalon (731) is disposed to the right of the first birefringent filter (730). The second birefringent filter (760) is disposed to the left of the second gain medium (750), and the second etalon (761) is disposed to the left of the second birefringent filter (760). The first beam splitter (726) is disposed to the left of the second etalon (761). In this configuration, the first gain medium (720) and the second gain medium (750), birefringent filters (730) and (760) and etalons (731) and (761) are identical.

During operation, the first gain medium (720) and the second gain medium (750) generate light at the first wavelength ($\lambda_1$) in response to laser diode pumps. The light from the first gain medium (720) and the second gain medium (750) is polarized and wavelength tuned by the first birefringent filter (730) and second birefringent filter (760), respectively and wavelength narrowed by etalons (731) and (761), respectively. The light from the gain medium (720) is focused by lens (732) and beam splitter (726) reflects the light at the first wavelength ($\lambda_1$) where it strikes the first non-linear crystal (722) as a focused elliptical beam (with an ellipticity between about 0.9 to 1.0), propagates through the first non-linear crystal (722), reflects off the mirror (736) back through the first non-linear crystal (722), reflects off beam splitter (726) and transmits through beam splitter (726) the second cavity (712) as a second harmonic of the first wavelength ($\lambda_1$). The light recirculates in the first cavity (710) at the first wavelength ($\lambda_1$) using the distributed Bragg reflector behind the gain medium (720) and the mirror (736) as end mirrors.

The light from the second gain medium (750) is also generated at the first wavelength ($\lambda_1$) and beam splitter (726) reflects the light at the first wavelength ($\lambda_1$) from the first cavity (710) to the second cavity (712) at the first wavelength ($\lambda_1$). The light recirculates in the second cavity (712) using the distributed Bragg reflector behind the second gain medium (750) and mirrors (736) and (738) as end mirrors. The light in the second cavity (712) is a mixed signal due to sum/difference frequency generation between first and second intermediate wavelengths. Since the first intermediate wavelength is a second harmonic of the first wavelength ($\lambda_1$) at 490 nm and the second intermediate wavelength is the first wavelength ($\lambda_1$) at 980 nm, the second wavelength ($\lambda_2$) is 660 nm (visible).

The second lens (734) focuses the light at the second wavelength ($\lambda_2$) as an elliptical beam (with an ellipticity between about 0.9 to 1.0), second beam splitter (728) reflects the light at the second wavelength ($\lambda_2$) where it passes through the second non-linear crystal (724), reflects off mirror (738) back through the second non-linear crystal (724), reflects off the second beam splitter (728) into the second cavity (712) at the second wavelength ($\lambda_2$) and transmits through second beam splitter (728) at the third wavelength ($\lambda_3$) to provide a laser output as previously described. However, since the second wavelength ($\lambda_2$) is at 660 nm, and the third wavelength ($\lambda_3$) is a second harmonic of the second wavelength ($\lambda_2$), the third wavelength ($\lambda_3$) is a third harmonic of the first wavelength ($\lambda_1$) at 330 nm (ultraviolet).

The laser systems are highly generalized to capture the essence of the present invention. An actual laser system may include additional optics as described in U.S. Pat. No. 9,231,373 to Fallahi et al., U.S. Pat. No. 10,511,145 to Fallahi et al. and U.S. patent application publication 2009/0274177 to Fan et al. The laser systems include optics such as gain mediums, crystals, beam splitters and so on described in greater detail in these references. The laser systems are well-suited for modifying related laser devices that may include curved mirrors or non-normal incidence reflection.

The laser systems above are non-limiting examples. For instance, a birefringent filter and/or etalon can be included in the first and/or second cavity segments. The crystals can be other non-linear optical crystals besides borate crystals. The first wavelength ($\lambda_1$) can be various wavelengths (preferably in the infrared region) depending on the gain medium.

The laser systems above not only increase crystal conversion efficiency and laser output power, but also provide numerous cavity designs that enable customization for specific applications. For instance, the wavelength separators can be beam splitters to increase laser output power using double-pass light transmission through the crystals provided more optics and laser cavity segments are included. Further, the cavity network can be a fully linear design.

As used herein, the term "about" refers to plus or minus 10% of the referenced number. Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting essentially of" or "consisting of", and as such the written description requirement for claiming one or more embodiments of the present invention using the phrase "consisting essentially of" or "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A laser system (100) comprising:
   a. a first cavity (110) coupled to a second cavity (112);
   b. a gain medium (120) that generates light at a first wavelength in the first cavity (110) using an energy source;
   c. a first non-linear optical element (122) that converts the light to a second wavelength in the first cavity (110);
   d. a second non-linear optical element (124) that converts the light to a third wavelength in the second cavity (112);
   e. a first wavelength separator (126) between the first cavity (110) and the second cavity (112);
   f. a second wavelength separator (128) in the second cavity (112); and
   g. one or more lenses (132) that focus the light as an elliptical beam into the first non-linear optical element (122), wherein the elliptical beam has an ellipticity of about 0.9 to 1.0, wherein the ellipticity is defined as a ratio of a minor axis to a major axis.

2. The laser system (100) of claim 1, wherein the gain medium (120) is within a VECSEL chip.

3. The laser system (100) of claim 1, wherein the energy source is a laser diode pump.

4. The laser system (100) of claim 1, wherein the first cavity (110) and the second cavity (112) are colinear and coaxial.

5. The laser system (100) of claim 1, wherein a second lens (134) is disposed between the first wavelength separator (126) and the second non-linear optical element (124), wherein the second lens (134) focuses the light as an elliptical beam into the second non-linear optical element (124), wherein the elliptical beam has an ellipticity of about 0.9 to 1.0.

6. The laser system (100) of claim 1, wherein the first wavelength separator (126) includes:
 a. a first mirror (126A) that transmits the light at the first wavelength towards the first non-linear optical element (122) and reflects the light at the second wavelength towards the first non-linear optical element (122); and
 b. a second mirror (126B) that reflects the light at the first wavelength towards the first non-linear optical element (122) and transmits the light at the second wavelength towards the second non-linear optical element (124).

7. The laser system (100) of claim 1, wherein the first wavelength separator (126) is a beam splitter.

8. The laser system (100) of claim 1, wherein the second wavelength separator (128) has a curved surface to focus the light as an elliptical beam into the second non-linear optical element, wherein the elliptical beam has an ellipticity of about 0.9 to 1.0.

9. The laser system (100) of claim 1, wherein the first non-linear optical element (122) and the second non-linear optical element (124) are borate crystals.

10. The laser system (100) of claim 1, wherein the one or more lenses (132) are a spherical lens.

11. The laser system (100) of claim 1, wherein the first wavelength is infrared light, the second wavelength is visible light and the third wavelength is ultraviolet light.

12. The laser system (100) of claim 1, wherein the third wavelength is a third harmonic of the first wavelength.

13. The laser system (100) of claim 1, wherein the third wavelength is a fourth harmonic of the first wavelength.

14. The laser system (100) of claim 1, wherein the first non-linear optical element (122) converts the first wavelength to the second wavelength and the second non-linear optical element (124) converts a mixed signal wavelength to the third wavelength.

15. The laser system (100) of claim 1, wherein the second wavelength is a second harmonic of the first wavelength and the third wavelength is a fourth harmonic of the first wavelength.

16. The laser system (100) of claim 1, wherein the second wavelength is a mixed signal of the first wavelength and a second harmonic of the first wavelength and the third wavelength second harmonic of the second wavelength and a third harmonic of the first wavelength.

17. The laser system (100) of claim 1, including a birefringent filter and an etalon in the first cavity (110), wherein the birefringent filter and the etalon are disposed between the gain medium (120) and the one or more lenses (132).

18. The laser system (100) of claim 1, wherein the laser system (100) is devoid of curved mirrors.

19. The laser system (100) of claim 1, wherein the laser system is devoid of non-normal incidence reflection.

* * * * *